US012573991B2

(12) United States Patent　　　　　(10) Patent No.:　US 12,573,991 B2
Tao et al.　　　　　　　　　　　　　　(45) Date of Patent:　　Mar. 10, 2026

(54) POWER SUPPLY REUSE FOR HIGH-POWER POWER AMPLIFIER

(71) Applicant: QUALCOMM Incorporated, San Diego, CA (US)

(72) Inventors: Chengwu Tao, Palo Alto, CA (US); Iulian Mirea, San Diego, CA (US); Song Shi, San Diego, CA (US); Jongshick Ahn, San Diego, CA (US); Carl Hardin, Encinitas, CA (US)

(73) Assignee: Qualcomm Incorporated, San Diego, CA (US)

( * ) Notice: Subject to any disclaimer, the term of this patent is extended or adjusted under 35 U.S.C. 154(b) by 321 days.

(21) Appl. No.: 18/339,093

(22) Filed: Jun. 21, 2023

(65) Prior Publication Data

US 2024/0429882 A1　　Dec. 26, 2024

(51) Int. Cl.
H04B 1/04　　　　(2006.01)
H03F 3/24　　　　(2006.01)
H04W 52/52　　　(2009.01)

(52) U.S. Cl.
CPC ............... H03F 3/245 (2013.01); H04B 1/04 (2013.01); *H03F 2203/21191* (2013.01)

(58) Field of Classification Search
CPC ...... H03F 1/0283; H03F 3/245; H03F 1/0211; H03F 1/0277; H03F 3/195; H03F 3/72; H03F 2200/294; H03F 2200/451; H03F 2200/507; H03F 2200/511; H03F 2200/516; H03F 2203/21191; H03F 2203/7227; H04B 1/04; H04B 7/18517
USPC ...................................................... 455/127.1
See application file for complete search history.

(56) References Cited

U.S. PATENT DOCUMENTS

| | | | |
|---|---|---|---|
| 2006/0084403 A1* | 4/2006 | Gilsdorf | H03F 3/24 |
| | | | 455/241.1 |
| 2011/0177790 A1* | 7/2011 | Monte | G08B 21/0277 |
| | | | 455/466 |
| 2012/0001695 A1* | 1/2012 | Seki | H03F 1/56 |
| | | | 330/295 |
| 2017/0006620 A1 | 1/2017 | Reis | |
| 2018/0048265 A1* | 2/2018 | Nentwig | H03F 3/217 |
| 2019/0288728 A1* | 9/2019 | Bai | H04B 1/44 |
| 2022/0329221 A1 | 10/2022 | Yang et al. | |

(Continued)

OTHER PUBLICATIONS

IP.com search history (Year: 2025).*
International Search Report and Written Opinion—PCT/US2024/030404—ISA/EPO—Sep. 16, 2024.

*Primary Examiner* — Moustapha Diaby
(74) *Attorney, Agent, or Firm* — Patterson & Sheridan LLP

(57)　　　　　　　ABSTRACT

Certain aspects of the present disclosure are directed towards an amplification circuit. The amplification circuit generally includes: a first amplifier; a first power supply having an output coupled to a supply input of the first amplifier and configured to provide a first power to the supply input of the first amplifier; a second amplifier; a second power supply having an output coupled to a supply input of the second amplifier and configured to provide a second power to the supply input of the second amplifier; and a third amplifier having a supply input coupled to the first power supply and the second power supply, the first power supply and the second power supply being further configured to provide a third power to the supply input of the third amplifier.

28 Claims, 6 Drawing Sheets

(56)                 References Cited

U.S. PATENT DOCUMENTS

| 2023/0011598 A1* | 1/2023 | Jang ........................ H03F 3/245 |
| 2023/0040041 A1 | 2/2023 | Jin et al. |

* cited by examiner

500

POWER SUPPLY REUSE FOR HIGH-POWER POWER AMPLIFIER

BACKGROUND

Field of the Disclosure

Certain aspects of the present disclosure generally relate to electronic components and, more particularly, to supplying power to circuitry for signal amplification.

Description of Related Art

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system). Wireless devices may include transmitters for processing signals for transmission via antennas. A transmitter may include a power amplifier (PA) for amplifying a signal for transmission.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure are directed towards an amplification circuit. The amplification circuit generally includes: a first amplifier; a first power supply having an output coupled to a supply input of the first amplifier and configured to provide a first power to the supply input of the first amplifier; a second amplifier; a second power supply having an output coupled to a supply input of the second amplifier and configured to provide a second power to the supply input of the second amplifier; and a third amplifier having a supply input coupled to the first power supply and the second power supply, the first power supply and the second power supply being further configured to provide a third power to the supply input of the third amplifier.

Certain aspects of the present disclosure are directed towards a transmitter. The transmitter generally includes: a first power amplifier (PA); a first power supply having an output coupled to a supply input of the first PA and configured to provide a first power to the supply input of the first PA, the first PA being configured to generate a first amplified signal for transmission with a first transmit power based on the first power; a second PA; a second power supply having an output coupled to a supply input of the second PA and configured to provide a second power to the supply input of the second PA, the second PA being configured to generate a second amplified signal for transmission with a second transmit power based on the second power; and a third amplifier having a supply input coupled to the first power supply and the second power supply, wherein the first power supply and the second power supply are further configured to provide a third power to the supply input of the third amplifier, the third amplifier being configured to generate a third amplified signal for transmission with a third transmit power based on the third power, the third transmit power being greater than the first transmit power and the second transmit power.

Certain aspects of the present disclosure are directed towards a method for signal amplification. The method generally includes: providing, via a first power supply, a first power to a supply input of a first amplifier; generating a first amplified signal via the first amplifier powered by the first power supply; providing, via a second power supply, a second power to a supply input of a second amplifier; generating a second amplified signal via the second amplifier powered by the second power supply; and providing, via the first power supply and the second power supply, a third power to the supply input of a third amplifier; and generating a third amplified signal via the third amplifier powered by the first power supply and the second power supply.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to an electrical device having one or more high-power power amplifiers (PAS). For example, the high-power PA may be used for the transmission of emergency signaling (e.g., an SOS distress signal) to a satellite. In some aspects, power may be provided to the high-power PA via multiple power supplies (e.g., switching regulators). The power supplies may be used for driving other PAs (e.g., in addition to the high-power PA). For instance, the power supplies may be configured to provide power for other PAs used for cellular transmissions.

The high-power PA may be seldom used for emergency transmissions, and in such rare instances, a high transmit power may be used. This high transmit power can be supplied to the high-power PA by a dedicated and special-ized power supply, which may consume a lot of area. Other single power supplies of the electrical device (e.g., for other Pas) may not be able to support the high transmit power specified for the high-power PA. Thus, multiple power supplies may be used to drive the high-power PA so that the electrical device can be implemented without a dedicated power supply for the high-power PA. In other words, a supply voltage for the high-power PA may be generated by ganging outputs of multiple power supplies coupled to other PAs (e.g., referred to herein as regular PAs that may be used for cellular transmissions).

In some aspects, the power supplies may be switching regulators used for average power or envelope tracking for the other PAs. Thus, the supply input of the high-power PA may be coupled to a switching architecture for the power supplies. While the power supplies may be used for average power or envelope tracking for the other PAS (e.g., for cellular transmissions), the power supplies may not imple-ment average power or envelope tracking when generating a supply voltage for the high-power PA. The power supplies may be part of a single integrated circuit (IC), multiple ICs, or a mix of both (e.g., two power supplies may be part of a first IC while a third power supply may be part of a second IC).

Example Wireless Communications

Figure 1:
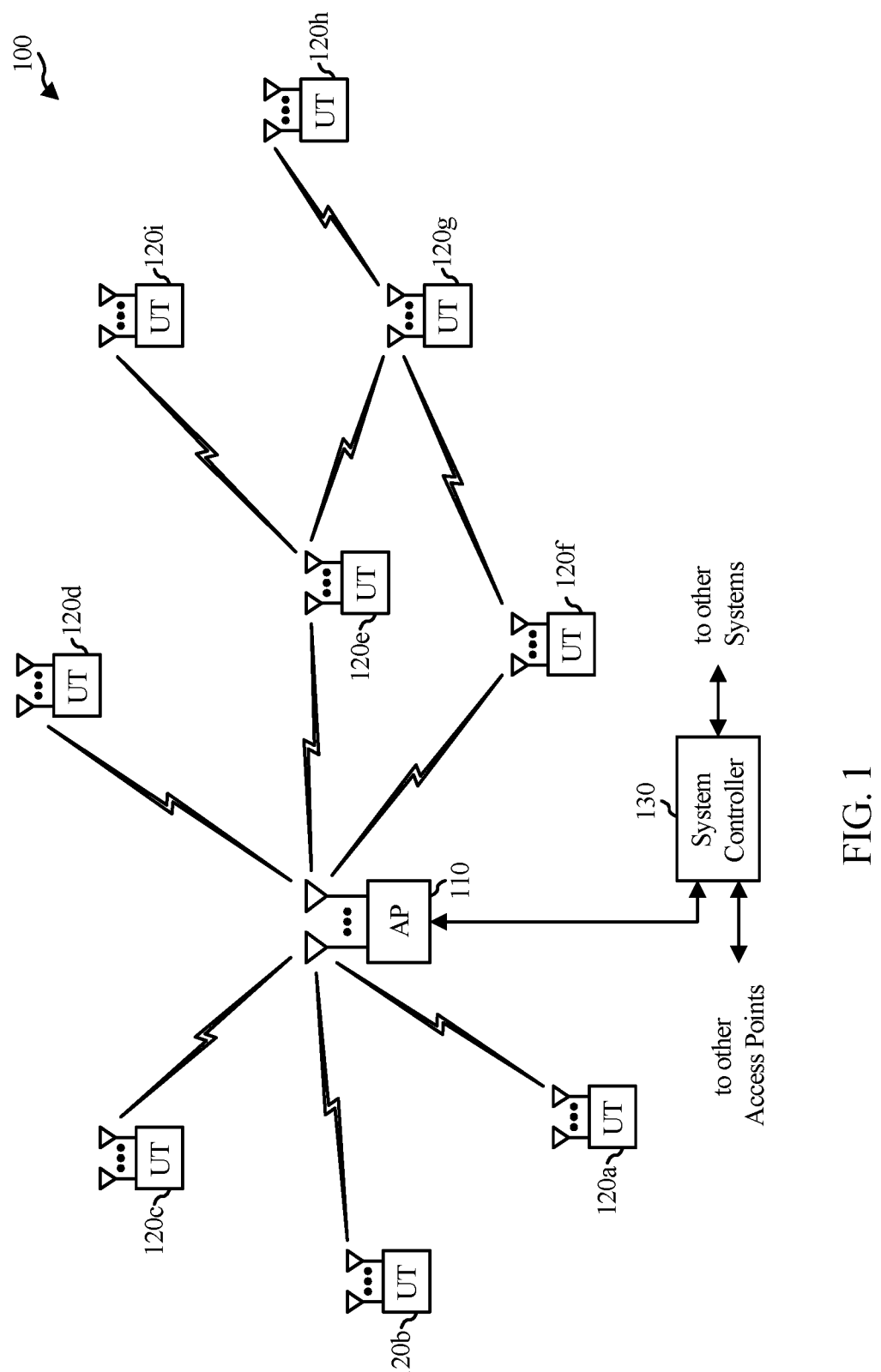
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that commu-nicates with the user terminals and may also be referred to as a base station (BS), an evolved Node B (eNB), a next generation Node B (gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communi-cation link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diver-sity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported).

In some aspects, the user terminal 120 or access point 110 may include multiple power supplies for generating a supply voltage for a power amplifier (PA).

Figure 2:
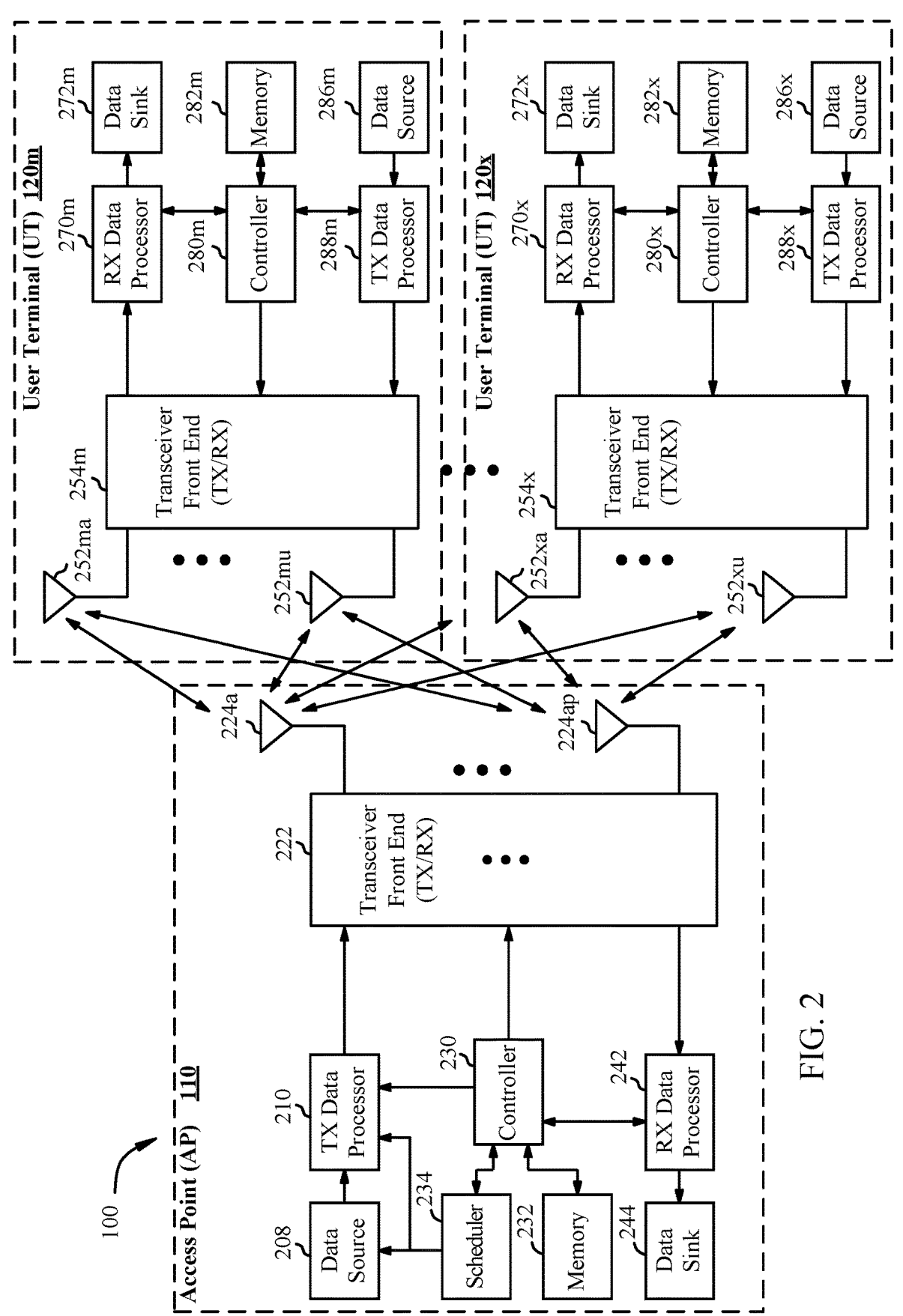
FIG. 2 is a block diagram of an example access point (AP) and example user terminals, in accordance with certain aspects of the present disclosure.

FIG. 2 shows a block diagram of access point 110 and two user terminals 120m and 120x in the wireless communica-tions system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "trans-mitting entity" is an independently operated apparatus or device capable of transmitting data via a frequency channel, and a "receiving entity" is an independently operated appa-ratus or device capable of receiving data via a frequency channel. In the following description, the subscript "dn" denotes the downlink, the subscript "up" denotes the uplink, $N_{up}$ user terminals are selected for simultaneous transmis-sion on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to gen-erate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

In some aspects, the transceiver front end 254 or 222 may include multiple power supplies for generating a supply voltage for a PA.

Figure 3:
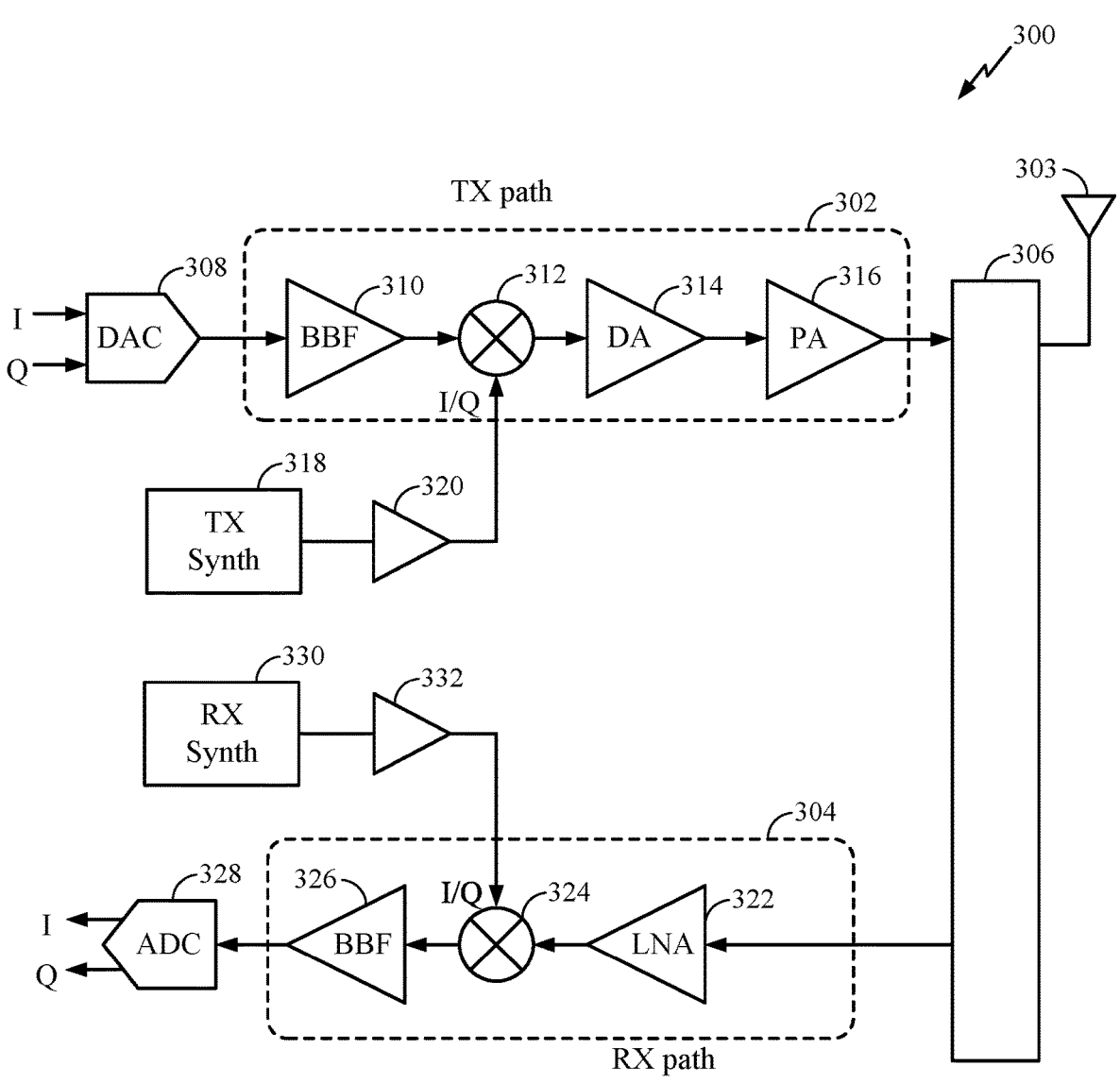
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced.

The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a PA 316. The BBF 310, the mixer 312, and the DA 314 may be included in a radio frequency integrated circuit (RFIC), while the PA 316 may be external to the RFIC. In some aspects, multiple power supplies may be used to concurrently provide power to a PA, such as the PA 316.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator. Some systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Techniques for Power Supply Reuse

The power amplifier (PA) is one of the most power-hungry components in a cellular or other wireless communication device. Thus, the PA may most likely be designed with power efficiency to reduce overall device power consumption and improve thermal performance. To improve the PA efficiency, some cellular PAs may be powered using an average power or envelope tracker. For example, the supply voltage for the PA may be generated based on (e.g., track) the average input power for the PA or the envelope of the input signal for the PA. The tracker may be tuned for the PA load range for improved power and silicon area efficiency. However, some devices have one or more PAs with high power specifications that may be beyond the device's tracker capabilities. For instance, a high-power PA may be implemented for a wireless device for high-power emergency transmissions to a satellite. The high-power PA may consume more power (e.g., twice the power) than other PAs of the device designed for cellular communications. Thus, a power supply (e.g., tracker) designed for a cellular PA may be unable to supply sufficient power for the emergency communication PA. Increasing the power capabilities of a power supply used for a cellular PA to be able to also supply power for the high-power PA may result in increased power consumption for cellular communications. Some devices may use a separate high-power regulator dedicated to supplying power to the high-power PA. However, implementing a separate, dedicated high-power regulator may result in increased area and power consumption and high cost given the seldom use of the high-power PA for emergency transmissions.

Certain aspects of the present disclosure are directed to using multiple power supplies (e.g., switching regulators or trackers) to concurrently provide power to a high-power PA. Switches may be used to selectively couple power supplies to the high-power PA, as described in more detail herein. The power supplies used to power the high-power PA may be located in a single power integrated circuit (IC) (e.g., tracker chip), or multiple power ICs. As one example, the high-power PA may be configured to receive a 5.5 V supply input with 2.5 A average current, which may be beyond the capabilities of any other single power supply of the device. To support the high-power PA, outputs of multiple power supplies may be coupled together to increase the overall output power capability for powering the high-power PA.

Figures 4A, 4B:
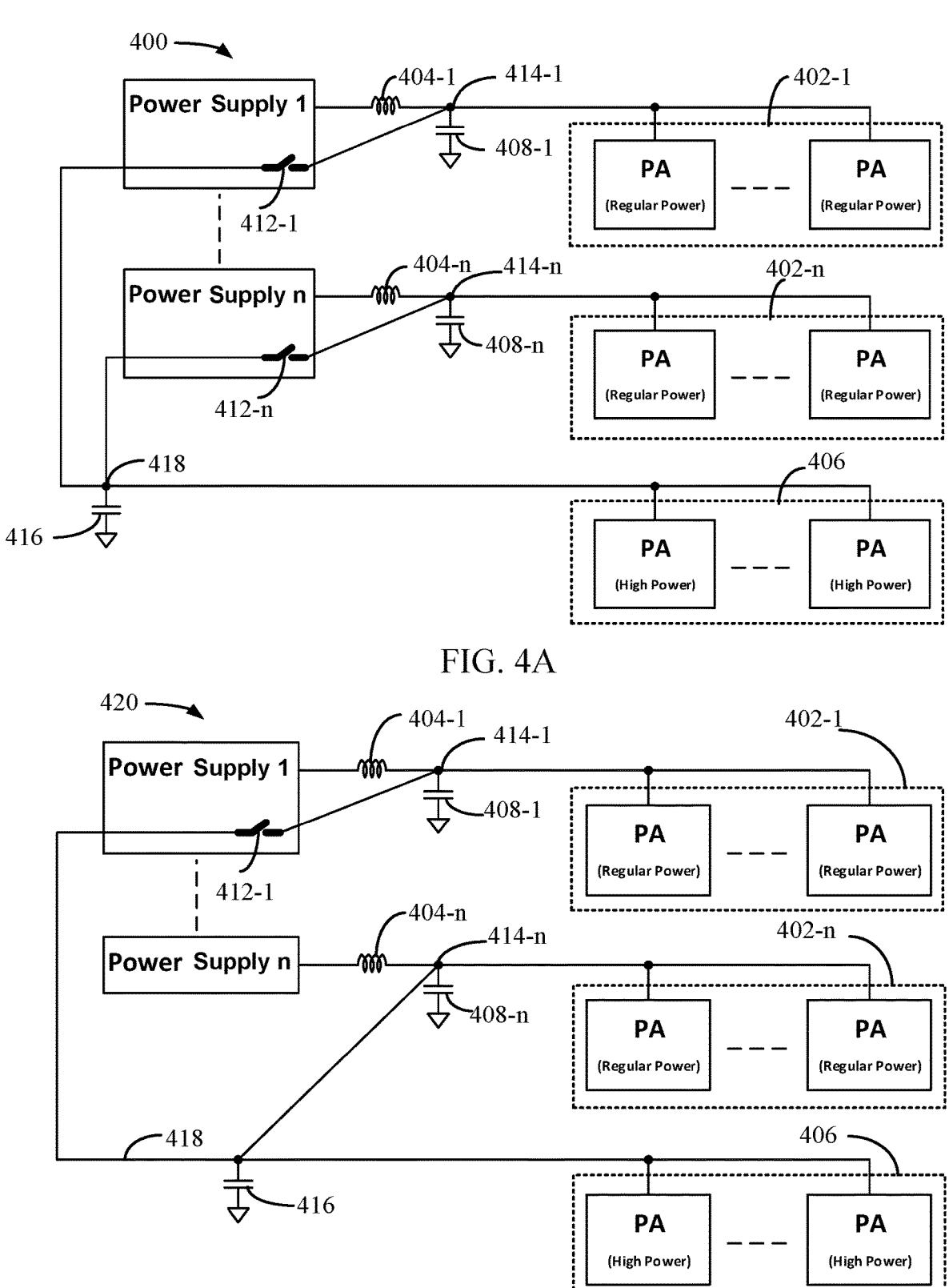
FIGS. 4A, 4B, 4C, and 4D are block diagrams illustrating example amplification circuits, in accordance with certain aspects of the present disclosure.

FIGS. 4A, 4B, 4C, and 4D are block diagrams illustrating example amplification circuits, in accordance with certain aspects of the present disclosure. FIG. 4A shows an amplification circuit 400 with power supplies in respective ICs having internal switches.

As shown in FIG. 4A, the amplification circuit 400 may include power supplies 1 to n, and one or more PAs 402-1 to 402-n, n being an integer greater than 1. The one or more PAs 402-1 to 402-n may correspond to the PA 316 described with respect to FIG. 3. Each of the power supplies may generate one or more supply voltages for powering one or more PAs. For example, the one or more PAs 402-1 may be coupled to an output of the power supply 1, and the one or more PAs 402-n may be coupled to an output of the power supply n. The amplification circuit 400 may also include one or more high-power PAs 406. The one or more PAs 402-1 to 402-n may be regular PAs (e.g., having lower power capabilities than the one or more high-power PAs 406).

Each of the power supplies 1 to n may be a switched-mode power supply (SMPS) implemented with an inductive element (e.g., respective inductive elements 404-1 to 404-n) and an output capacitive element (e.g., respective capacitive elements 408-1 to 408-n). The inductive elements 404-1 to 404-n are coupled between respective power supplies 1-n and respective output nodes 414-1 to 414-n. The capacitive elements 408-1 to 408-n are coupled between the respective output nodes 414-1 to 414-n and a reference potential node (e.g., electrical ground).

In some aspects, each of the power supplies 1 to n may be part of a chip including a switch (e.g., respective switches 412-1 to 412-n). The switches 412-1 to 412-n may be controlled to selectively couple respective output nodes 414-1 to 414-n to the one or more high-power PAs 406 at node 418. In some aspects, a capacitive element 416 may be coupled between the node 418 and the reference potential node.

In some aspects, to transmit a high-power signal via the one or more high-power PAs, at least two of the switches 412-1 to 412-n may be closed to couple at least two of the power supplies 1-n to the high-power PAs 406. At least two of the power supplies 1 to n may generate a supply voltage for the one or more high-power PAs. When a power supply is powering the one or more high-power PAs 406, the associated regular PA of the power supply may be disabled. For example, when power supply 1 (e.g., along with one or more other power supplies) is powering the one or more high-power PAs 406, the one or more PAs 402-1 may be disabled. The associated switch for each of the power supplies 1 to n may be open when the power supply is powering a regular PA (e.g., switch 412-1 may be open when power supply 1 is powering the one or more PAs 402-1). When the one or more high-power PAs 406 are not being used, all the switches 412-1 to 412-n may be open, such that the high-power PAs do not consume any power.

FIG. 4B is a block diagram illustrating an amplification circuit 420 with one or more power supplies implemented in an IC having an internal switch, in accordance with certain aspects of the present disclosure. That is, at least one of the power supplies 1 to n may be part of an IC having an internal switch for selectively coupling a respective output node to the one or more high-power PAs 406. At least another one of the power supplies 1 to n may be coupled to the one or more high-power PAs 406 (e.g., directly coupled without a switch), as shown.

When a power supply (e.g., power supply n) directly coupled to the one or more high-power PAs 406 is powering an associated regular PA (e.g., one or more PAS 402-n), the one or more high-power PAs 406 may be disabled. When a power supply is powering the one or more high-power PAs 406, the regular PA(s) associated with the power supply may be disabled. For example, when power supply n (e.g., along with one or more other power supplies) is powering the one or more high-power PAs 406, the one or more PAs 402-n may be disabled.

Figures 4C, 4D:
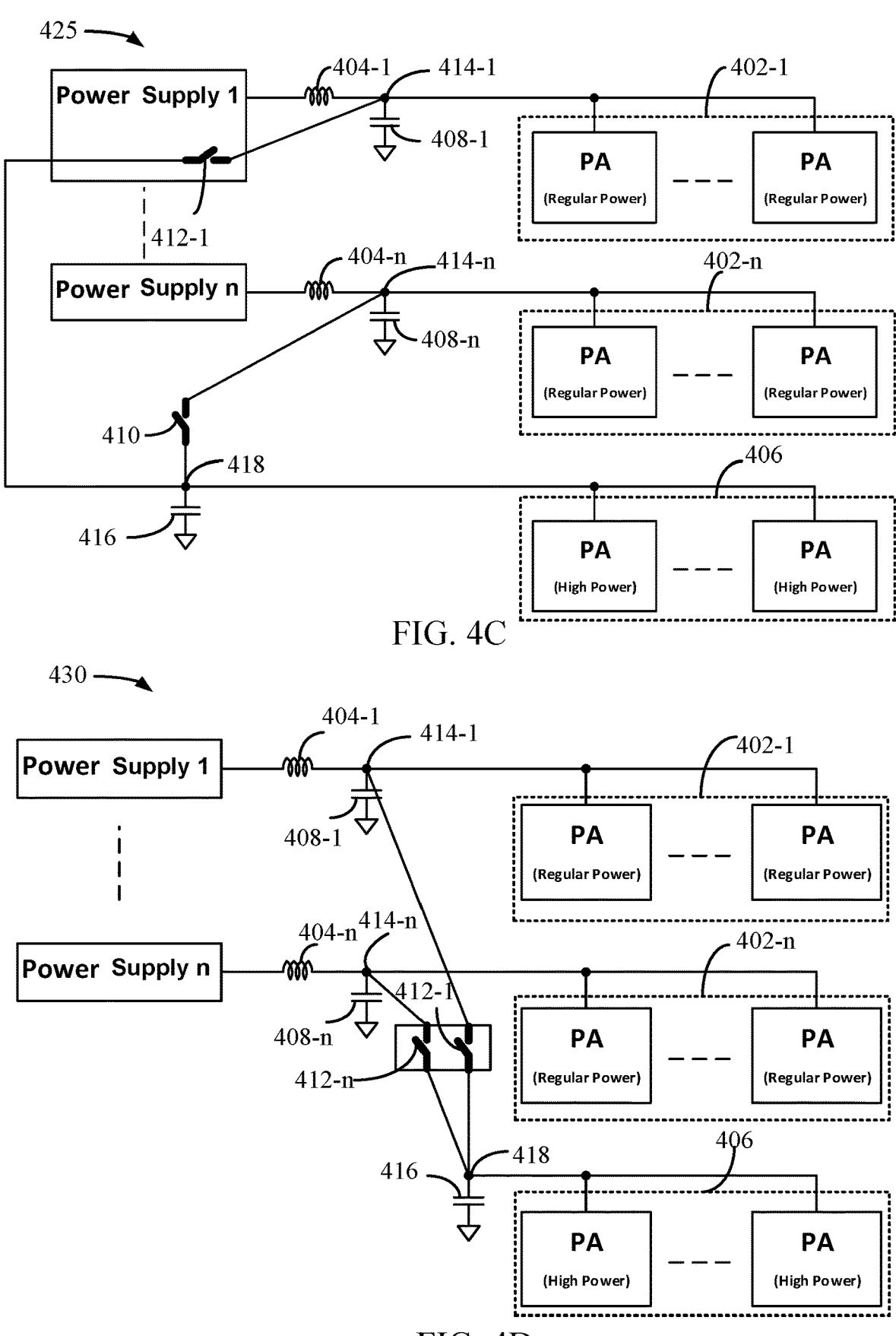

FIG. 4C is a block diagram illustrating an amplification circuit 425 with one or more power supplies being part of an IC and using an external switch for coupling to a high-power PA, in accordance with certain aspects of the present disclosure. For example, as shown, a switch 410 may be coupled between the output node 414-n and the node 418 coupled to the one or more high-power PAs 406. The switch 410 may be external to an IC having the power supply n. The switch 410 may be closed when power supply n (e.g., along with one or more other power supplies) is providing power to the one or more high-power PAs 406. The switch 410 may be open at other times (e.g., when power supply n is providing power to the one or more PAs 402-n).

FIG. 4D is a block diagram illustrating an amplification circuit 430 having external switches for coupling power supplies to one or more high-power PAs, in accordance with certain aspects of the present disclosure. For example, the amplification circuit 430 may include switches 412-1 to 412-n for selectively coupling respective power supplies 1 to n to the one or more high-power PAs 406. The switches 412-1 to 412-n may be external to ICs used to implement the power supplies. To transmit a high-power signal via the one or more high-power PAs, at least two of the switches 412-1 to 412-n may be closed to couple at least two of the power supplies 1 to n to the high-power PAs 406. The at least two of the power supplies 1 to n may generate a supply voltage for the one or more high-power PAs. When a power supply is powering the one or more high-power PAs 406, the associated regular PA of the power supply may be disabled. For example, when power supply 1 (e.g., along with one or more other power supplies) is powering the one or more high-power PAs 406, the one or more PAs 402-1 may be disabled. The associated switch for each of the power supplies 1 to n may be open when the power supply is powering a regular PA (e.g., switch 412-1 may be opened when power supply 1 is powering the one or more PAs 402-1).

In some aspects, when each power supply is powering an associated regular PA, the power supply be configured as an average power or envelope tracking power supply. On the other hand, when powering the high-power PA, the power supply may be configured as a regular power supply (e.g., without average power or envelope tracking) to provide power to the high-power PA along with one or more other power supplies.

In some aspects, in order for two power supplies to efficiently provide power to a high-power PA, one of the power supplies may be set to continuous conduction mode (CCM) configured to provide a slightly higher output voltage, but also configured with a current limit. Another one of the power supplies may be set to a slightly lower voltage and configured in discontinuous conduction mode (DCM). CCM refers to a mode of an SMPS where the inductive element of the SMPS continuously conducts. On the other hand. DCM is a mode of an SMPS where the current in the inductive element reaches zero in each switching cycle (e.g., does not continuously conduct).

As an example, assume power supply 1 and power supply 2 are providing power to the one or more high-power PAs 406. The associated regular PAs for power supply 1 and power supply 2 may be disabled. Power supply 1 and power supply 2 may be coupled to the one or more high-power PAs. Power supply 1 may be configured to provide an output voltage of 5.6 V in CCM mode, and configured with a current limit of 1.25 A. Power supply 2 may be configured to provide a 5.5 V output voltage in DCM mode. Thus, power supply 1 may provide load current to the one or more high-power PAs 406 up to the current limit of 1.25 A. Since the output voltage of power supply 1 is higher than the output voltage of power supply 2, power supply 2 maintains a high-impedance state (e.g., power supply 2 has a high output impedance due to power supply 1 being configured to provide a higher output voltage). As the load current drawn by the one or more high-power PAs exceeds 1.25 A, the current limit of power supply 1 may be reached, resulting in the output voltage of power supply 1 dropping to 5.5 V. Thus, power supply 2 (e.g., configured to provide a 5.5 V output voltage) may no longer be in a high-impedance state and begins to provide current to the one or more high-power PAs. Thus, once the 1.25 A load current is reached, both power supplies 1 and 2 provide current to the load (e.g., the one or more high-power PAs 406).

Figure 5:
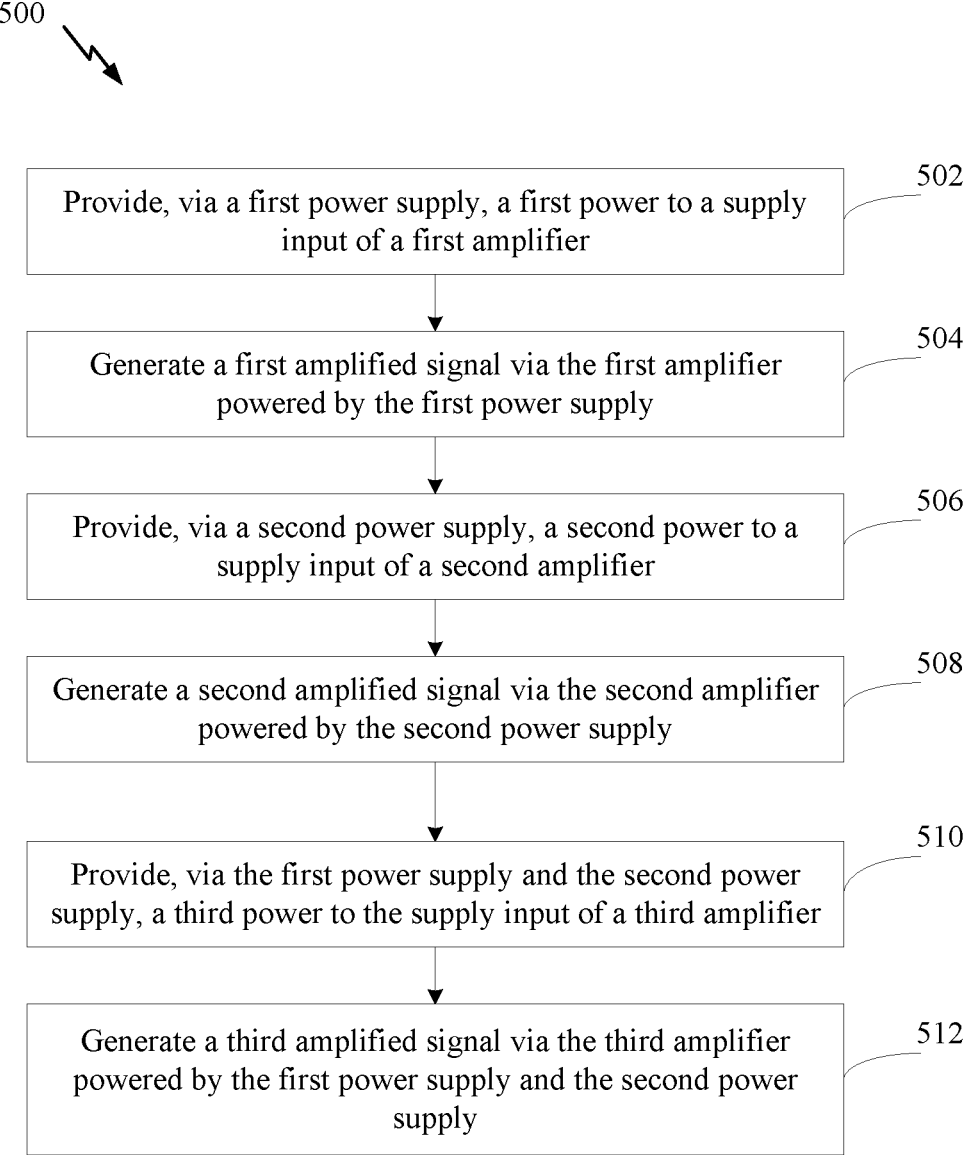
FIG. 5 is a flow diagram illustrating example operations for signal amplification, in accordance with certain aspects of the present disclosure.

FIG. 5 is a flow diagram depicting example operations 500 for signal amplification, in accordance with certain aspects of the present disclosure. For example, the operations 500 may be performed by an amplification circuit, such as the amplification circuit 400, 420, 425, or 430, and in some aspects, a transceiver such as the transceiver front end 300.

The operations 500 begin, at block 502, with the amplification circuit powering, via a first power supply (e.g., power supply 1 of FIGS. 4A, 4B, 4C, and 4D), a first power to a supply input of a first amplifier (e.g., the one or more PAs 402-1 of FIGS. 4A, 4B, 4C, and 4D). In some cases, the first power provided to the supply input of the first amplifier may be generated based on an average power or an envelope of an input signal for the first amplifier. At block 504, the amplification circuit generates a first amplified signal via the first amplifier powered by the first power supply.

At block 506, the amplification circuit provides, via a second power supply (e.g., power supply n of FIGS. 4A, 4B, 4C, and 4D), a second power to a supply input of a second amplifier. At block 508, the amplification circuit generates a second amplified signal via the second amplifier (e.g., the one or more PAs 402-n) powered by the second power supply.

At block 510, the amplification circuit provides, via the first power supply and the second power supply, a third power to the supply input of a third amplifier (e.g., the one or more high-power PAs 406). At block 512, the amplification circuit generates a third amplified signal via the third amplifier powered by the first power supply and the second power supply. In some aspects, the transceiver transmits an emergency signal based on the third amplified signal. For example, the transceiver may transmit a signal to a satellite based on the third amplified signal.

In some aspects, the transceiver transmits a signal with a first transmit power based on the first amplified signal, and transmits a signal with a second transmit power based on the second amplified signal. The transceiver may also transmit a signal with a third transmit power greater than the first transmit power and the second transmit power based on the third amplified signal.

In some aspects, the amplification circuit may selectively couple (e.g., via switch 412-1) the first power supply to the third amplifier prior to providing the third power. The amplification circuit may selectively couple (e.g., via switch 412-n) the second power supply to the third amplifier prior to providing the third power. In some aspects, the amplification circuit may disable the first amplifier and the second amplifier before the first power supply and the second power supply provide the third power to the supply input of the third amplifier.

In some aspects, providing the third power to the supply input of the third amplifier may include operating the first power supply in a CCM and operating the second power supply in a DCM. Moreover, providing the third power to the supply input of the third amplifier may include configuring the first power supply to generate a first output voltage and configuring the second power supply to generate a second output voltage less than the first output voltage. Providing the third power to the supply input of the third amplifier may include providing, via the first power supply, an output current up to a current threshold.

Example Aspects

Aspect 1: An amplification circuit, comprising: a first amplifier; a first power supply having an output coupled to a supply input of the first amplifier and configured to provide a first power to the supply input of the first amplifier; a second amplifier; a second power supply having an output coupled to a supply input of the second amplifier and configured to provide a second power to the supply input of the second amplifier; and a third amplifier having a supply input coupled to the first power supply and the second power supply, the first power supply and the second power supply being further configured to provide a third power to the supply input of the third amplifier.

Aspect 2: The amplification circuit of Aspect 1, wherein the third amplifier is configured to amplify a signal for transmission of an emergency signal.

Aspect 3: The amplification circuit of Aspect 1 or 2, wherein the third amplifier is configured to amplify a signal for transmission to a satellite.

Aspect 4: The amplification circuit according to any of Aspects 1-3, wherein the first amplifier and the second amplifier are configured to amplify signals for cellular transmissions.

Aspect 5: The amplification circuit according to any of Aspects 1-4, wherein: the first amplifier is configured to amplify signaling for transmission with a first transmit power; the second amplifier is configured to amplify signaling for transmission with a second transmit power; and the third amplifier is configured to amplify signaling for transmission with a third power greater than the first transmit power and the second transmit power.

Aspect 6: The amplification circuit according to any of Aspects 1-5, further comprising a first switch coupled between the first power supply and the supply input of the third amplifier and configured to couple the first power supply to the third amplifier prior to the third power being provided.

Aspect 7: The amplification circuit of Aspect 6, further comprising a second switch coupled between the second power supply and the supply input of the third amplifier and configured to couple the second power supply to the third amplifier prior to the third power being provided.

Aspect 8: The amplification circuit of Aspect 6 or 7, wherein the first amplifier and the first switch are part of an integrated circuit (IC).

Aspect 9: The amplification circuit according to any of Aspects 1-8, wherein the first power supply is configured to provide the first power to the supply input of the first amplifier based on an average power or an envelope of an input signal for the first amplifier.

Aspect 10: The amplification circuit of Aspect 9, wherein the second power supply is configured to provide the second power to the supply input of the second amplifier based on an average power or an envelope of an input signal for the second amplifier.

Aspect 11: The amplification circuit according to any of Aspects 1-10, wherein each of the first power supply and the second power supply comprises a switched-mode power supply (SMPS).

Aspect 12: The amplification circuit according to any of Aspects 1-11, wherein the first amplifier and the second amplifier are configured to be disabled before the first power supply and the second power supply provide the third power to the supply input of the third amplifier.

Aspect 13: The amplification circuit according to any of Aspects 1-12, wherein, to provide the third power to the supply input of the third amplifier, the first power supply is configured to operate in a continuous conduction mode (CCM) and the second power supply is configured to operate in a discontinuous conduction mode (DCM).

Aspect 14: The amplification circuit according to any of Aspects 1-13, wherein, to provide the third power to the supply input of the third amplifier, the first power supply is configured to generate a first output voltage and the second power supply is configured to generate a second output voltage less than the first output voltage.

Aspect 15: The amplification circuit according to any of Aspects 1-14, wherein, to provide the third power to the supply input of the third amplifier, the first power supply is configured to provide an output current up to a current threshold.

Aspect 16: A transmitter, comprising: a first power amplifier (PA); a first power supply having an output coupled to a supply input of the first PA and configured to provide a first power to the supply input of the first PA, the first PA being configured to generate a first amplified signal for transmission with a first transmit power based on the first power; a second PA; a second power supply having an output coupled to a supply input of the second PA and configured to provide a second power to the supply input of the second PA, the second PA being configured to generate a second amplified signal for transmission with a second transmit power based on the second power; and a third PA having a supply input coupled to the first power supply and the second power supply, wherein the first power supply and the second power supply are further configured to provide a third power to the supply input of the third PA, the third PA being configured to generate a third amplified signal for transmission with a third transmit power based on the third power, the third transmit power being greater than the first transmit power and the second transmit power.

Aspect 17: The transmitter of Aspect 16, wherein: the first amplified signal and the second amplified signal are for cellular transmissions; and the third amplified signal is for transmission to a satellite.

Aspect 18: The transmitter of Aspect 16 or 17, wherein, to provide the third power to the supply input of the third PA, the first power supply is configured to operate in a continuous conduction mode (CCM) and the second power supply is configured to operate in a discontinuous conduction mode (DCM).

Aspect 19: The transmitter according to any of Aspects 16-18, wherein, to provide the third power to the supply input of the third PA, the first power supply is configured to generate a first output voltage and the second power supply is configured to generate a second output voltage less than the first output voltage.

Aspect 20: A method for wireless communication, comprising: providing, via a first power supply, a first power to a supply input of a first amplifier; generating a first amplified signal via the first amplifier powered by the first power supply; providing, via a second power supply, a second power to a supply input of a second amplifier; generating a second amplified signal via the second amplifier powered by the second power supply; providing, via the first power supply and the second power supply, a third power to a supply input of a third amplifier; and generating a third amplified signal via the third amplifier powered by the first power supply and the second power supply.

Aspect 21: The method of Aspect 20, further comprising transmitting an emergency signal based on the third amplified signal.

Aspect 22: The method of Aspect 20 or 21, further comprising transmitting a satellite signal based on the third amplified signal.

Aspect 23: The method according to any of Aspects 20-22, further comprising: transmitting a signal with a first transmit power based on the first amplified signal; transmitting a signal with a second transmit power based on the second amplified signal; and transmitting a signal with a third power greater than the first transmit power and the second transmit power based on the third amplified signal.

Aspect 24: The method according to any of Aspects 20-23, further comprising coupling, via a first switch, the first power supply to the third amplifier prior to providing the third power.

Aspect 25: The method of Aspect 24, further comprising coupling, via a second switch, the second power supply to the third amplifier prior to providing the third power.

Aspect 26: The method according to any of Aspects 20-25, wherein the first power provided to the supply input of the first amplifier is generated based on an average power or an envelope of an input signal for the first amplifier.

Aspect 27: The method according to any of Aspects 20-26, further comprising disabling the first amplifier and the second amplifier before the first power supply and the second power supply provide the third power to the supply input of the third amplifier.

Aspect 28: The method according to any of Aspects 20-27, wherein providing the third power to the supply input of the third amplifier includes operating the first power supply in a continuous conduction mode (CCM) and operating the second power supply in a discontinuous conduction mode (DCM).

Aspect 29: The method according to any of Aspects 20-28, wherein providing the third power to the supply input of the third amplifier includes configuring the first power supply to generate a first output voltage and configuring the second power supply to generate a second output voltage less than the first output voltage.

Aspect 30: The method according to any of Aspects 20-29, wherein providing the third power to the supply input of the third amplifier includes providing, via the first power supply, an output current up to a current threshold.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, and/or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An amplification circuit, comprising:
   a first amplifier configured to amplify signaling for transmission with a first transmit power;
   a first power supply having an output coupled to a supply input of the first amplifier and configured to provide a first power to the supply input of the first amplifier;
   a second amplifier configured to amplify signaling for transmission with a second transmit power;
   a second power supply having an output coupled to a supply input of the second amplifier and configured to provide a second power to the supply input of the second amplifier; and
   a third amplifier configured to amplify signaling for transmission with a third transmit power greater than the first transmit power and the second transmit power and having a supply input coupled to the first power supply and the second power supply, the first power supply and the second power supply being further configured to collectively provide a third power to the supply input of the third amplifier to facilitate the transmission with the third transmit power greater than the first transmit power and the second transmit power.

2. The amplification circuit of claim 1, wherein the third amplifier is configured to amplify a signal for transmission of an emergency signal.

3. The amplification circuit of claim 1, wherein the third amplifier is configured to amplify a signal for transmission to a satellite.

4. The amplification circuit of claim 1, wherein the first amplifier and the second amplifier are configured to amplify signals for cellular transmissions.

5. The amplification circuit of claim 1, further comprising a first switch coupled between the first power supply and the supply input of the third amplifier and configured to couple the first power supply to the third amplifier prior to the third power being provided.

6. The amplification circuit of claim 5, further comprising a second switch coupled between the second power supply and the supply input of the third amplifier and configured to couple the second power supply to the third amplifier prior to the third power being provided.

7. The amplification circuit of claim 5, wherein the first amplifier and the first switch are part of an integrated circuit (IC).

8. The amplification circuit of claim 1, wherein the first power supply is configured to provide the first power to the supply input of the first amplifier based on an average power or an envelope of an input signal for the first amplifier.

9. The amplification circuit of claim 8, wherein the second power supply is configured to provide the second power to the supply input of the second amplifier based on an average power or an envelope of an input signal for the second amplifier.

10. The amplification circuit of claim 1, wherein each of the first power supply and the second power supply comprises a switched-mode power supply (SMPS).

11. The amplification circuit of claim 1, wherein the first amplifier and the second amplifier are configured to be disabled before the first power supply and the second power supply provide the third power to the supply input of the third amplifier.

12. The amplification circuit of claim 1, wherein, to provide the third power to the supply input of the third amplifier, the first power supply is configured to operate in a continuous conduction mode (CCM) and the second power supply is configured to operate in a discontinuous conduction mode (DCM).

13. The amplification circuit of claim 1, wherein, to provide the third power to the supply input of the third amplifier, the first power supply is configured to generate a first output voltage and the second power supply is configured to generate a second output voltage less than the first output voltage.

14. The amplification circuit of claim 1, wherein, to provide the third power to the supply input of the third amplifier, the first power supply is configured to provide an output current up to a current threshold.

15. A transmitter, comprising:
a first power amplifier (PA);
a first power supply having an output coupled to a supply input of the first PA and configured to provide a first power to the supply input of the first PA, the first PA being configured to generate a first amplified signal for transmission with a first transmit power based on the first power;
a second PA;

a second power supply having an output coupled to a supply input of the second PA and configured to provide a second power to the supply input of the second PA, the second PA being configured to generate a second amplified signal for transmission with a second transmit power based on the second power; and
a third PA having a supply input coupled to the first power supply and the second power supply, wherein the first power supply and the second power supply are further configured to collectively provide a third power to the supply input of the third PA, the third PA being configured to generate a third amplified signal for transmission with a third transmit power based on the third power, the third transmit power being greater than the first transmit power and the second transmit power.

16. The transmitter of claim 15, wherein:
the first amplified signal and the second amplified signal are for cellular transmissions; and
the third amplified signal is for transmission to a satellite.

17. The transmitter of claim 15, wherein, to provide the third power to the supply input of the third PA, the first power supply is configured to operate in a continuous conduction mode (CCM) and the second power supply is configured to operate in a discontinuous conduction mode (DCM).

18. The transmitter of claim 15, wherein, to provide the third power to the supply input of the third PA, the first power supply is configured to generate a first output voltage and the second power supply is configured to generate a second output voltage less than the first output voltage.

19. A method for wireless communication, comprising:
providing, via a first power supply, a first power to a supply input of a first amplifier;
generating a first amplified signal via the first amplifier powered by the first power supply to transmit a signal with a first transmit power;
providing, via a second power supply, a second power to a supply input of a second amplifier;
generating a second amplified signal via the second amplifier powered by the second power supply to transmit a signal with a second transmit power;
providing, collectively via the first power supply and the second power supply, a third power to a supply input of a third amplifier; and
generating a third amplified signal via the third amplifier powered by the first power supply and the second power supply to transmit a signal with a third transmit power greater than the first transmit power and the second transmit power.

20. The method of claim 19, further comprising transmitting an emergency signal based on the third amplified signal.

21. The method of claim 19, further comprising transmitting a satellite signal based on the third amplified signal.

22. The method of claim 19, further comprising coupling, via a first switch, the first power supply to the third amplifier prior to providing the third power.

23. The method of claim 22, further comprising coupling, via a second switch, the second power supply to the third amplifier prior to providing the third power.

24. The method of claim 19, wherein the first power provided to the supply input of the first amplifier is generated based on an average power or an envelope of an input signal for the first amplifier.

25. The method of claim 19, further comprising disabling the first amplifier and the second amplifier before the first power supply and the second power supply provide the third power to the supply input of the third amplifier.

26. The method of claim 19, wherein providing the third power to the supply input of the third amplifier includes operating the first power supply in a continuous conduction mode (CCM) and operating the second power supply in a discontinuous conduction mode (DCM).

27. The method of claim 19, wherein providing the third power to the supply input of the third amplifier includes configuring the first power supply to generate a first output voltage and configuring the second power supply to generate a second output voltage less than the first output voltage.

28. The method of claim 19, wherein providing the third power to the supply input of the third amplifier includes providing, via the first power supply, an output current up to a current threshold.

\* \* \* \* \*